United States Patent
Sansur

(10) Patent No.: US 6,169,807 B1
(45) Date of Patent: Jan. 2, 2001

(54) REMOTE AUTOMATIC AUDIO LEVEL CONTROL DEVICE

(76) Inventor: Michael Sansur, 2402 Harbor Blvd. Apt. 206, Costa Mesa, CA (US) 92626

( * ) Notice: Under 35 U.S.C. 154(b), the term of this patent shall be extended for 0 days.

(21) Appl. No.: 08/944,073
(22) Filed: Oct. 4, 1997
(51) Int. Cl.[7] .................................................. H03G 3/20
(52) U.S. Cl. ............................................. 381/57; 381/107
(58) Field of Search .................................. 381/56, 57, 58, 381/104, 105, 109, 107

(56) References Cited

U.S. PATENT DOCUMENTS

| 4,553,257 | 11/1985 | Mori . |
|---|---|---|
| 5,077,799 | 12/1991 | Cotton . |
| 5,128,987 | 7/1992 | McDonough . |
| 5,363,147 | 11/1994 | Joseph . |
| 5,444,783 | 8/1995 | Na . |
| 5,631,714 | 5/1997 | Saadoun . |
| 5,633,690 | 5/1997 | Eum . |

Primary Examiner—Ping Lee
(74) Attorney, Agent, or Firm—Michael A. Painter

(57) ABSTRACT

An automatic audio level control device for adjusting the audio level of an appliance in response to changes in ambient sound levels. A microprocessor (16) monitors the ambient sound produced by an audio appliance using a microphone (10) to determine average low and high audio thresholds. When the ambient sound level is outside the threshold range, the microprocessor transmits volume control signals using infrared emitter (20) to the audio appliance to sustain a user-defined average audio level.

11 Claims, 2 Drawing Sheets

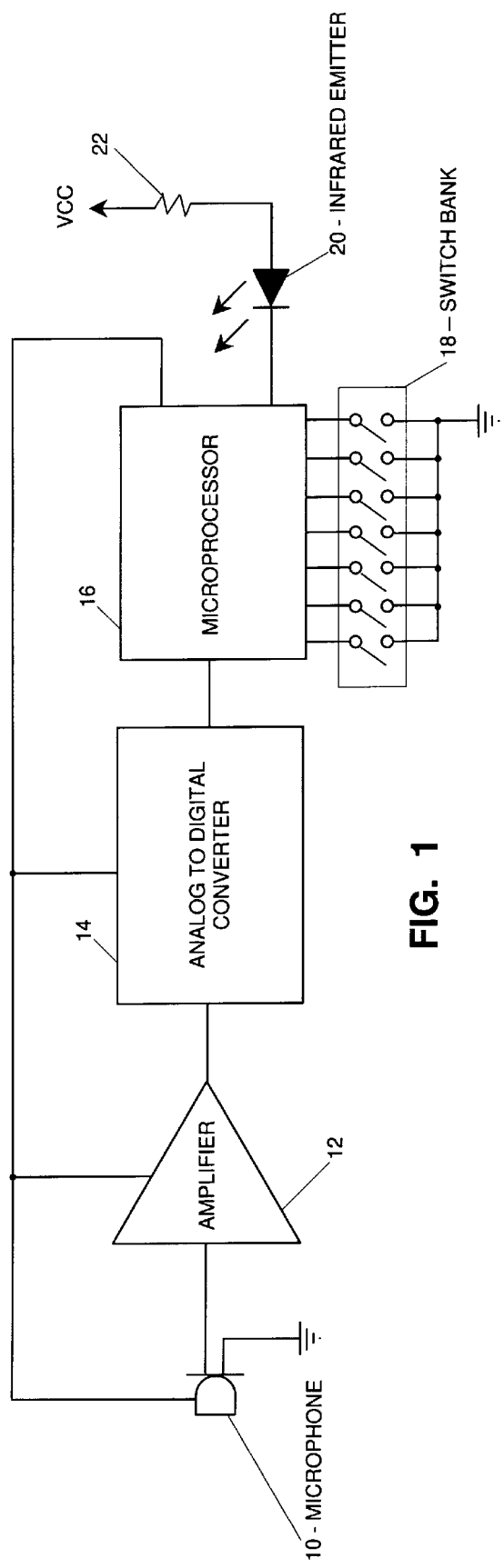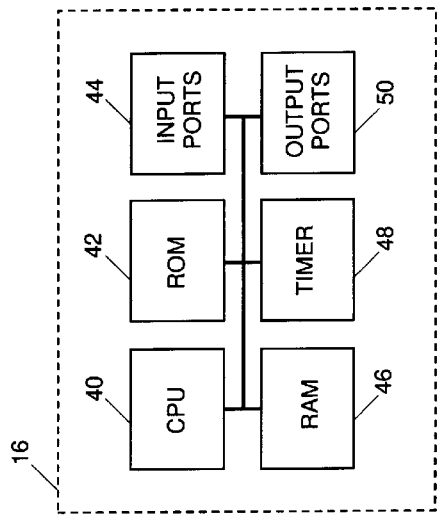

REMOTE AUTOMATIC AUDIO LEVEL CONTROL DEVICE

FIELD OF INVENTION

This invention relates to an automatic adaptive audio volume control device and in particular to an electronic circuit for remote automatic volume adjustment of an audio appliance.

BACKGROUND OF INVENTION

Radio and television receivers often produce disagreeable changes in the average audio volume level when a user changes channels or when a broadcaster inserts advertising segments. Program transitions to advertising or from speech to music frequently produce a greater average volume level that exceeds the desired volume level.

The user can compensate for such audio variances through the bothersome task of manually adjusting the volume during each channel or program transition.

Various systems have been created to automatically adapt average volume levels in audio appliances. Radio receivers in motor vehicles have been designed to adapt volume levels based on external ambient sound, typically road noise, which varies with vehicle speed. Similar systems have been incorporated into television receivers to maintain an average audio volume level by adapting to changes in the received audio signal.

While automatic audio level control systems are available on some audio appliances, the user is typically required to purchase a completely new appliance to gain this feature. U.S. Pat. No. 5,363,147 to Joseph et al. (1994) and U.S. Pat. No. 5,444,783 to Na (1995) disclose circuits that, when incorporated into television receivers, provide automatic audio level control.

An external device providing automatic audio level control for television receivers has been proposed in U.S. Pat. No. 5,631,714 to Saadoun (1997). This solution requires access to input and output paths for both the audio and video signals of a television receiver to operate. The numerous connectors and cables for these signals further increase the cost of production of this device.

All previous solutions for automatic audio level control are either built into an appliance or, if external, are specific to an appliance and thus do not have the flexibility to operate with various audio appliances in a convenient manner.

OBJECTS AND ADVANTAGES

Accordingly, several objects and advantages of the present invention are:

(a) to provide a system to automatically sustain a user-defined average audio volume level of an appliance during channel changes and program transitions in audio level;

(b) to provide a system that determines the user-defined average audio volume level by acoustically monitoring the ambient sound level produced by an audio appliance;

(c) to provide adaptive control of an appliance audio level by responding to changes in the ambient sound level produced by the audio appliance;

(d) to operate with an audio appliance that utilizes a wireless remote control interface to change the appliance audio volume level; and (e) to provide a low cost device that is simple to use and that requires no electrical connections to be installed to the audio appliance;

Further objects and advantages of the invention will become apparent from a consideration of the drawings and ensuing description.

DRAWING FIGURES

FIG. 1 is a block diagram showing the key elements of a system of the invention for automatically sustaining a user-defined average audio volume level for an audio appliance.

FIG. 1A is a block diagram showing functional units within a typical microprocessor.

Figure 2:
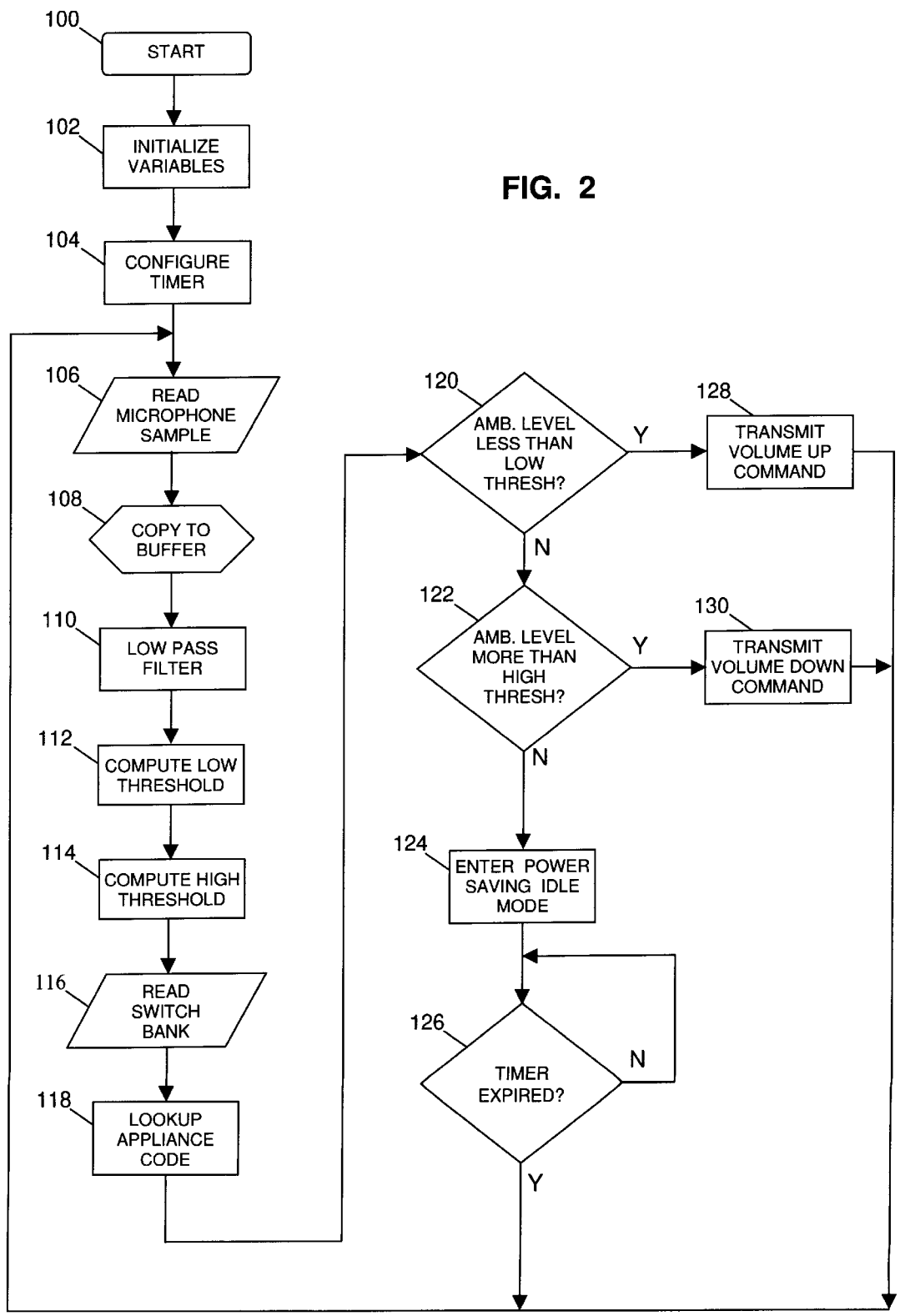
FIG. 2 is a flowchart diagram outlining the software control system of the invention.

| Reference Numerals in Drawings | |
|---|---|
| 10 Microphone | 12 Amplifier |
| 14 Digital-to-Analog Converter | 16 Microprocessor |
| 18 Switch Bank | 20 Infrared Emitter |
| 22 Resistor | 40 CPU |
| 42 ROM | 44 Set of Input Ports |
| 46 RAM | 48 Timer |
| 50 Set of Output Ports | 100–130 Flowchart Labels |

SUMMARY

In accordance with the present invention an automatic audio level control device comprises a microprocessor that monitors the ambient sound produced by an audio appliance using a microphone to continuously determine average low and high audio thresholds. When the ambient sound level is outside the threshold range, the microprocessor transmits remote volume control signals using an infrared emitter to the audio appliance to sustain an average audio level.

DESCRIPTION OF THE PREFERRED EMBODIMENT

Referring to FIG. 1, a microphone 10 produces an analog electrical signal that is proportional to the magnitude of the ambient sound. The output signal from microphone 10 is fed through an amplifier 12, which increases the magnitude of the signal from microphone 10.

The output of amplifier 12 is connected to the input of an analog-to-digital converter 14. The output of analog-to-digital converter 14 is a digital value having a magnitude that is proportional to the ambient sound sensed by microphone 10.

The output of analog-to-digital converter 14 is connected to a first input port of a microprocessor 16. A switch bank 18 is connected to a second input port of microprocessor 16. A first output port of microprocessor 16 is connected to the cathode of an infrared emitter 20. A second output port of microprocessor 16 is connected to power inputs of microphone 10, amplifier 12, and analog-to-digital converter 14. The anode of infrared emitter 20 is connected to system voltage VCC through a resistor 22, which limits the current to infrared emitter 20.

FIG. 1A shows the functional units within microprocessor 16. A CPU 40 is connected through a common bus to a RAM 46, a ROM 44, a timer 48, a set of input ports 44, and a set of output ports 50.

Operation

The logical flow of FIG. 2 shows the sequence of operation of a control program performing audio level control using the circuit shown in FIG. 1.

Referring to FIG. 2, the control program begins at step 100 when system power is first applied. Program variables are initialized in step 102.

In step 104, the timer in the microprocessor is initialized. This timer is used to control the frequency of execution of program steps for measuring ambient sound levels. These measurements are required infrequently (typically less than 20 times per second). Thus, power savings are achieved by placing the microprocessor into a low-power idle state when the control program is not required to operate.

In step 106, a digital sample from the microphone is recorded. Further power savings are achieved by applying power to the microphone, amplifier, and digital to analog converter only during this program step.

The digital sample is copied to a buffer in step 108. A low-pass filter algorithm is performed on this buffer by step 110 to calculate the ambient sound level.

In steps 112 and 114, low and high audio threshold levels are determined. An average ambient sound level is first computed by averaging the ambient sound level over a fixed period of time. The threshold levels are then calculated from the averages of measured low-level and high-level ambient sound. A low-level measurement is one that is less the average ambient sound level. All other measurements are considered high-level.

In step 116, the switch bank is read. The settings of the switch bank represent an appliance manufacturer number that the user has configured. This value is used to look-up appliance codes for volume-up and volume-down commands in step 118. The use of such appliance codes is well known in the prior art for devices such as universal infrared remote controls.

If the ambient sound level is less than the computed low threshold level in step 120, control is passed to step 128, which transmits an appliance volume-up command via the infrared emitter. Program execution then continues at step 106.

Otherwise, in step 122, if the ambient sound level is greater than the computed high threshold level, control is passed to step 130, which transmits an appliance volume-down command via the infrared emitter. Program execution then continues at step 106.

Step 124 is executed if the ambient sound level lies between the low and high threshold levels. Here the microprocessor is placed into a power-saving idle mode. Control is passed to step 126, which waits for the system timer to expire. When the timer expiration occurs, program execution continues at step 106.

Conclusions, Ramifications, and Scope

Accordingly, the automatic sound level control device of the invention maintains a user-defined average audio sound level of an appliance. In addition, it functions with audio appliances that utilize wireless remote control, requires no electrical connections to the appliance, and is simple to operate.

The invention may be practiced in many ways other than as specifically described herein. For example, another possible embodiment could substitute the low-pass filtering of program step 110 with a simple external analog filter. Another hardware substitution could utilize a microprocessor that includes a built-in analog-to-digital converter rather than the external converter shown in FIG. 1. A final alternative embodiment is the combination of the invention with a universal remote control device to gain economy by sharing common hardware and software resources.

Thus, the scope of the invention should be determined not by the embodiment illustrated, but by the appended claims and their legal equivalents.

What is claimed is:

1. A device for automatically adjusting an audio appliance volume level to a selected average volume level comprising:

means for acoustically sampling an output of said audio appliance;

means coupled to said acoustical sampling means for signal processing;

means for determining an ambient audio level of said audio appliance;

means for determining a selected average volume level from said ambient audio level;

means for calculating a maximum threshold level from both said selected average volume level and said ambient audio level;

means for calculating a minimum threshold level from both said selected average volume level and said ambient audio level;

means for comparing said ambient audio level with both said maximum threshold level and said minimum threshold level, and for generating a comparison value as a result of said comparing;

means coupled to said comparing means for transmitting a wireless control signal to adjust said audio appliance volume level in dependence on said comparison value; and means coupled to said signal processing means for initializing said maximum threshold level, said minimum threshold level, and said selected average volume level all to initial values.

2. The device of claim 1, wherein said means for acoustically sampling said audio appliance volume level comprises a microphone followed by an amplifier followed by an analog-to-digital converter.

3. The device of claim 1, wherein said means for signal processing comprises a microprocessor.

4. The device of claim 1, wherein said means for determining said ambient audio level comprises a low-pass filter.

5. The device of claim 1, wherein said means for determining said selected average volume level comprises an average of said ambient audio level over a fixed period of time.

6. The device of claim 1, wherein said means for calculating said maximum threshold level comprises an average, over a fixed period of time, of ambient audio levels that are greater than or equal to the selected average volume level.

7. The device of claim 1, wherein said means for calculating said minimum threshold level comprises an average, over a fixed period of time, of ambient audio levels that are less than the selected average volume level.

8. The device of claim 1, wherein said means for transmitting a wireless control signal comprises an infrared emitter coupled to said microprocessor.

9. The device of claim 8, wherein said means for transmitting a wireless control signal further comprises appliance volume control codes stored in said microprocessor.

10. A method for automatically adjusting an audio appliance volume level to a selected average volume level using a signal processing system having an acoustic input consisting of a microphone followed by an amplifier followed by an analog-to-digital converter, a memory, a microprocessor coupled to the memory for executing a control program, a buffer in the memory for storing a plurality of acoustic data samples, the microprocessor further coupled to the analog-to-digital converter output, and an infrared emitter coupled to the microprocessor; the method comprising the steps of:

acquiring acoustic data samples into the buffer;

applying a low-pass filter on the buffer to calculate an ambient audio level;

calculating a selected average volume level by computing an average of the ambient audio level over a fixed period of time;

calculating a maximum threshold level by averaging over said fixed period of time, the ambient audio levels that are greater than or equal to the selected average audio level;

calculating a minimum threshold level by averaging over said fixed period of time, the ambient audio levels that are less than the selected average audio level;

comparing the ambient audio level with the minimum and maximum threshold levels; and transmitting audio appliance volume control signals via the infrared emitter to maintain the audio appliance volume level between the threshold levels, thus maintaining the selected average volume level.

11. A method for automatically adjusting an audio appliance volume level to a selected average volume level using a signal processing system having an acoustic input consisting of a microphone followed by an amplifier followed an analog low-pass filter followed by an analog-to-digital converter, a memory, a microprocessor coupled to the memory for executing a control program, the microprocessor further coupled to the analog-to-digital converter output, and an infrared emitter coupled to the microprocessor; the method comprising the steps of:

acquiring acoustic data samples that represent an ambient audio level;

calculating a selected average volume level by computing an average of the ambient audio level over a fixed period of time;

calculating a maximum threshold level by averaging over said fixed period of time, the ambient audio levels that are greater than or equal to the selected average volume level;

calculating a minimum threshold level by averaging over said fixed period of time, the ambient audio levels that are less than the selected average volume level;

comparing the ambient audio level with the minimum and maximum threshold levels; and transmitting audio appliance volume control signals via the infrared emitter to maintain the average audio appliance volume level between the threshold levels, thus maintaining the selected average volume level.

* * * * *